United States Patent

Miles

[11] Patent Number: 6,046,622
[45] Date of Patent: Apr. 4, 2000

[54] ELECTRONIC ANALOGUE SWITCH

[75] Inventor: John David Miles, Gloucestershire, United Kingdom

[73] Assignee: Telefonaktiebolaget LM Ericsson, Sweden

[21] Appl. No.: 09/112,523

[22] Filed: Jul. 9, 1998

[30] Foreign Application Priority Data

Jul. 16, 1997 [GB] United Kingdom ............... 9714986

[51] Int. Cl.[7] .............................................. H03K 17/687
[52] U.S. Cl. ............................................. 327/427; 327/534
[58] Field of Search .................................. 327/365, 427, 327/534; 326/113

[56] References Cited

U.S. PATENT DOCUMENTS

| | | | |
|---|---|---|---|
| 4,513,212 | 4/1985 | Money | 307/575 |
| 4,565,960 | 1/1986 | Takata et al. | 323/317 |
| 4,857,984 | 8/1989 | Lucas | 357/41 |
| 4,988,894 | 1/1991 | Takiba et al. | 307/296.1 |
| 5,442,218 | 8/1995 | Seidel et al. | 257/369 |

FOREIGN PATENT DOCUMENTS

| | | |
|---|---|---|
| 88 291 | 9/1983 | European Pat. Off. . |
| 58-13027 | 1/1983 | Japan . |
| 58-13030 | 1/1983 | Japan . |
| 61-54711 | 3/1986 | Japan . |
| 63-98214 | 4/1988 | Japan . |
| 1-157614 | 6/1989 | Japan . |
| 07046108 | 2/1995 | Japan . |

*Primary Examiner*—Jeffrey Zweizig
*Attorney, Agent, or Firm*—Jenkens & Gilchrist, P.C.

[57] ABSTRACT

An analogue switch formed on a semiconductor substrate has input and output ports, and a first enhancement mode MOS transistor formed in an isolated well in the substrate material and having its gate connected to receive a control signal, and having one end of its conducting channel and its well connected to the input port. A second enhancement mode MOS transistor is formed in an isolated well in the substrate, and has one end of its conducting channel and its well connected to the input port (204), and has its gate connected to the other end of the conducting channel of the first transistor. A third enhancement mode MOS transistor is formed in an isolated well in the substrate, and has its gate connected to receive the complement of the said control signal, and has its conducting channel connected between the output port and the other end of the conducting channel of the second transistor, and has its well connected to one of the supply lines of the switch. Control circuits are connected to the gate of the second transistor for maintaining the second transistor in an opposite state to that of the first transistor.

12 Claims, 4 Drawing Sheets

ELECTRONIC ANALOGUE SWITCH

TECHNICAL FIELD OF THE INVENTION

The present invention relates to an electronic analogue switch, and in particular to an analogue switch using MOS transistors.

DESCRIPTION OF THE RELATED ART

Analogue switches including metal oxide semiconductor (MOS) transistors have conventionally incorporated both p-channel and n-channel MOS transistors. The n-channel transistor normally has its body connected to the most negative power supply line of the device. However, when the source of the NMOS device goes more negative than the negative supply, a PN junction diode between the source and the body of the NMOS device will be forward biased. Thus current will flow from the negative supply into the node to which the analogue switch connects. This current flow compromises the desired high OFF resistance of the switch.

For example, a typical CMOS transistor switch is shown and described in FIG. 3.36 and on pages 142 and 143 of "The Art of Electronics", Horowitz and Hill, 2nd Ed. Cambridge University Press. A PMOS transistor is connected in parallel with an NMOS transistor, the transistors receiving logically opposite control signals. This arrangement serves to ensure that the ON resistance of the switch is desirably low. However, as mentioned above, the OFF resistance is compromised when the input drops below 0v, since this drop results in forward biasing the p-n junction in the NMOS transistor.

SUMMARY OF THE PRESENT INVENTION

The present invention seeks to improve the maximum allowable operating voltage of an analogue switch, when the switch is in the OFF position.

According to the present invention, there is provided an analogue switch formed on a semiconductor substrate, and comprising: input and output ports, a first enhancement mode MOS transistor formed in an ohmic isolated well in the substrate material and having its gate connected to receive a control signal, and having one end of its conducting channel and its well connected to the input port, a second enhancement mode MOS transistor formed in an isolated well in the substrate, and having one end of its conducting channel and its well connected to the input port, and having its gate connected to the other end of the conducting channel of the first transistor, a third enhancement mode MOS transistor formed in an isolated well in the substrate, and having its gate connected to receive the complement of the said control signal, and having its conducting channel connected between the output port and the other end of the conducting channel of the second transistor, and having its well connected to one of the supply lines of the switch, and control means connected to the gate of the second transistor for maintaining the second transistor in an opposite state to that of the first transistor.

In one embodiment, each MOS transistor has its conducting channel of the same type of semiconductor material as the substrate, and is formed in a well of semiconductor material of opposite type to that of the substrate.

The substrate material may be n-type semiconductor material, the wells being of p-type semiconductor material and the transistors NMOS transistors. The well of the third transistor is then connected to the most negative supply line of the switch. This arrangement improves the maximum negative operating voltage when the switch is in the OFF position.

Alternatively, the substrate material may be p-type semiconductor material, the wells being of n-type semiconductor material, and the transistors PMOS transistors. The well of the third transistor is then connected to the most positive supply line of the device. This arrangement improves the maximum positive operating voltage, when the switch is in the OFF position.

In an alternative embodiment, each transistor is formed in a trench of an electrically isolating oxide material. Each such MOS transistor may be an NMOS device, with the well of the third MOS transistor connected to the most negative supply line of the switch, or each MOS transistor may be a PMOS device, with the well of the third MOS transistor connected to the most positive supply line of the switch The control means preferably comprises a device which tends to turn the second MOS transistor ON. Such a control means may comprise an enhancement mode MOS transistor having its gate connected to receive the control signal and its conducting channel connected between a power supply line and the gate of the second transistor.

When the circuit transistors are NMOS, the enhancement mode transistor is a PMOS transistor, having its conducting channel connected to a positive power supply line of the device.

Alternatively, the control means may comprise a switched resistor.

DETAILED DESCRIPTION OF THE DRAWINGS

Figure 1:
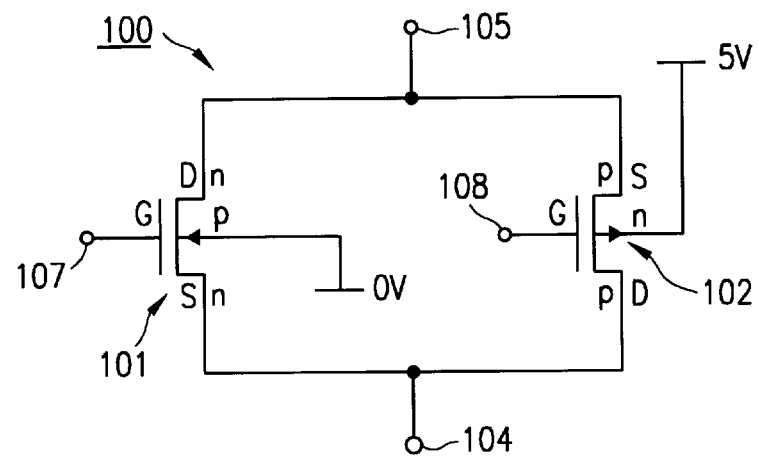
FIG. 1 shows a circuit diagram of a conventional analogue switch.

A conventional analogue MOS transistor switch 100 is shown in FIG. 1, and comprises an NMOS transistor 101 and a PMOS transistor 102. The switch has an input port 104 and an output port 105. The signal to be switched is connected to the input port 104, and is transmitted to the output port 105 when the switch is in an ON state. The gate G of the NMOS transistor 101 is connected to a control signal input 107, and the gate G of the PMOS transistor 102 is connected to a control signal input 108.

The body of the NMOS transistor is connected to the most negative supply line of the device, whilst the body of the PMOS transistor is connected to the most positive supply line. In the case shown in FIG. 1, these supply lines are at 0v and 5v respectively.

When the control input 107 is low (i.e. 0v) and the control input 108 is high (i.e. 5v) the switch is in an OFF condition, and so no current is transmitted between the input and output ports 104 and 105.

However, if the signal at the input port 104 should drop below the voltage to which the body of the NMOS transistor is connected (0v) then the PN junction diode formed between the body and source of the NMOS transistor 101, becomes forward biased. Thus, current can flow from the negative supply into the input node. Any such current flow compromises the desired high OFF resistance of the switch.

Figure 2:
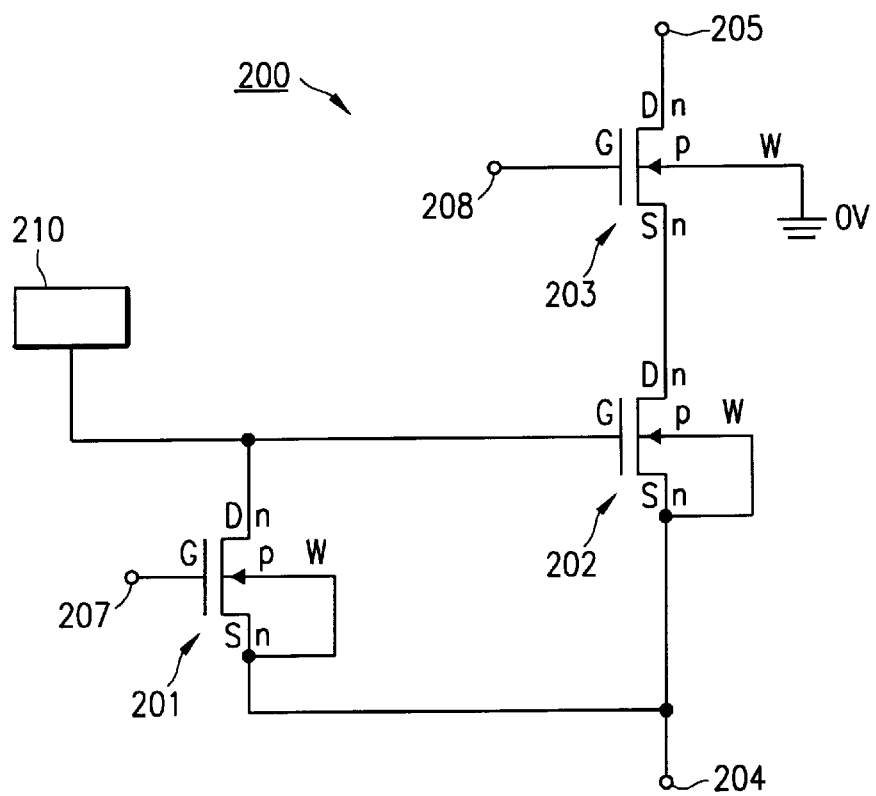
FIG. 2 shows a general circuit diagram of a first embodiment of the present invention.

FIG. 2 shows a first embodiment 200 of the present invention, which comprises first, second and third NMOS transistors 201, 202 and 203. The first NMOS transistor 201 is connected to a control input 207 at its gate G. The source S and well W of the first MOS transistor 201 are connected to an input port 204 of the device. The transistor 201 thus operates in enhancement mode.

The second and third MOS transistors 202 and 203 are connected with their conducting channels in series between the input port 204 and an output port 205 of the device. That is, the source S of the transistor 202 is connected to the input port, the drain D of the transistor 202 is connected to the source S of the transistor 203, and the drain D of the transistor 203 is connected to the output port 205. The gate G of the second MOS transistor 202 is connected to the drain D of the first MOS transistor 201 and to a control device 210.

The gate G of the third transistor 203 is connected to a second control input 208, which receives the complement of the signal applied to the first control input 207, and the well W of this device is connected to the most negative supply line of the switch.

The control device 210 is connected to the gate G of the second transistor 202 and operates to try to switch that transistor 202 to an ON state, in opposition to the first MOS transistor 201.

For the switch to be in an OFF condition, a high (5v) control signal is applied to the control input 207, and a low (0v) control signal applied to the control input 208. The high control signal turns transistor 201 ON, which causes the gate G of the transistor 202 to be pulled down to the voltage level of the input port 204. Thus the gate-source voltage Vgs of the transistor 202 is held at 0v, which ensures that the transistor 202 remains in an OFF condition.

The gate G of the third transistor 203 is held at 0v in this OFF condition, which ensures that the third transistor 203 also remains in an OFF condition.

The control device 210 operates to ensure that the second MOS transistor turns ON successfully when the switch is ON. The device could be provided by a PMOS transistor, a switched resistor, an unswitched resistor or a current source, provided by MOS or bipolar devices.

In order to turn the switch ON, a low (0v) signal is applied to the control input 207, and a high (5v) signal to the control input 208. These signals turn the first transistor 201 OFF, which allows the device 210 to pull the second transistor ON. The third transistor is also pulled ON, and so the switch is in an ON state.

Unlike in the previously-considered circuit of FIG. 1, the PN junctions of the transistors 201 and 202 between the source and body of those transistors, remain unbiased in the OFF state, even if the voltage at the control input 204 becomes more negative than the negative supply voltage by a voltage up to the threshold voltage of the transistor 201. As a result, leakage current cannot flow between the input and output ports 204 and 205 of the switch.

Thus the OFF state negative voltage range which can be applied to the input port 204 is much improved over the previously-considered circuit design. The maximum negative voltage possible is then primarily based on the reverse bias breakdown voltages of the reversed biased PN junctions between the well W and drain D of the respective transistors, and is limited by the threshold value of transistor 201.

It will be appreciated that although FIG. 2 shows only NMOS devices, the transistors of the circuit embodying the present invention could be PMOS devices.

Figure 3:
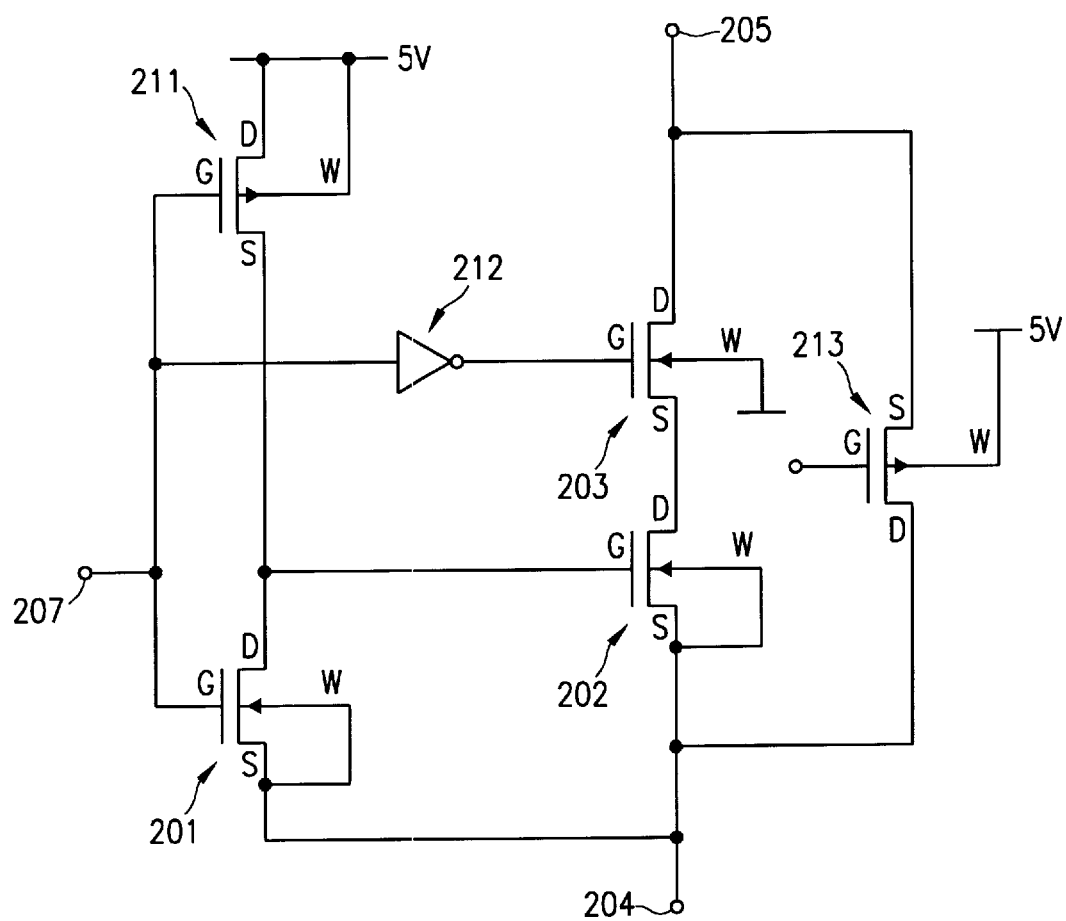
FIG. 3 shows a modification to the embodiment of FIG. 2.

FIG. 3 shows a modification of the FIG. 2 circuit, in which the device 210 is constituted by a PMOS transistor 211. An inverter 212 is connected between the control input 207 and the gate of the third transistor 203 in order to provide that transistor with the complement of the control signal supplied to the input 207.

In addition, a second PMOS transistor 213 is connected in parallel with the second and third NMOS transistors 202 and 203, and is connected to receive a control signal 214. As in the conventional circuit shown in FIG. 1, the PMOS transistor 213 serves to reduce the ON resistance of the switch, and is turned ON by a low input control signal.

The FIG. 3 circuit has all the advantages of the FIG. 2 circuit, and in particular the maximum negative voltage allowable at the input port 204 when the switch is in an OFF position is improved over prior art devices.

The PMOS transistor 211 receives the control signal from the control input 207, so that when the first NMOS transistor 201 is ON, the PMOS transistor 211 is OFF, and vice versa. This PMOS transistor 211 acts to ensure that the second NMOS transistor 202 is pulled into an ON state when the switch is turned ON. If the PMOS transistor 211 or other device was not provided then, when the transistor 201 is OFF, the gate voltage of the second NMOS transistor 202 will float, which leads to uncertainty of the overall switch condition.

Figure 4:
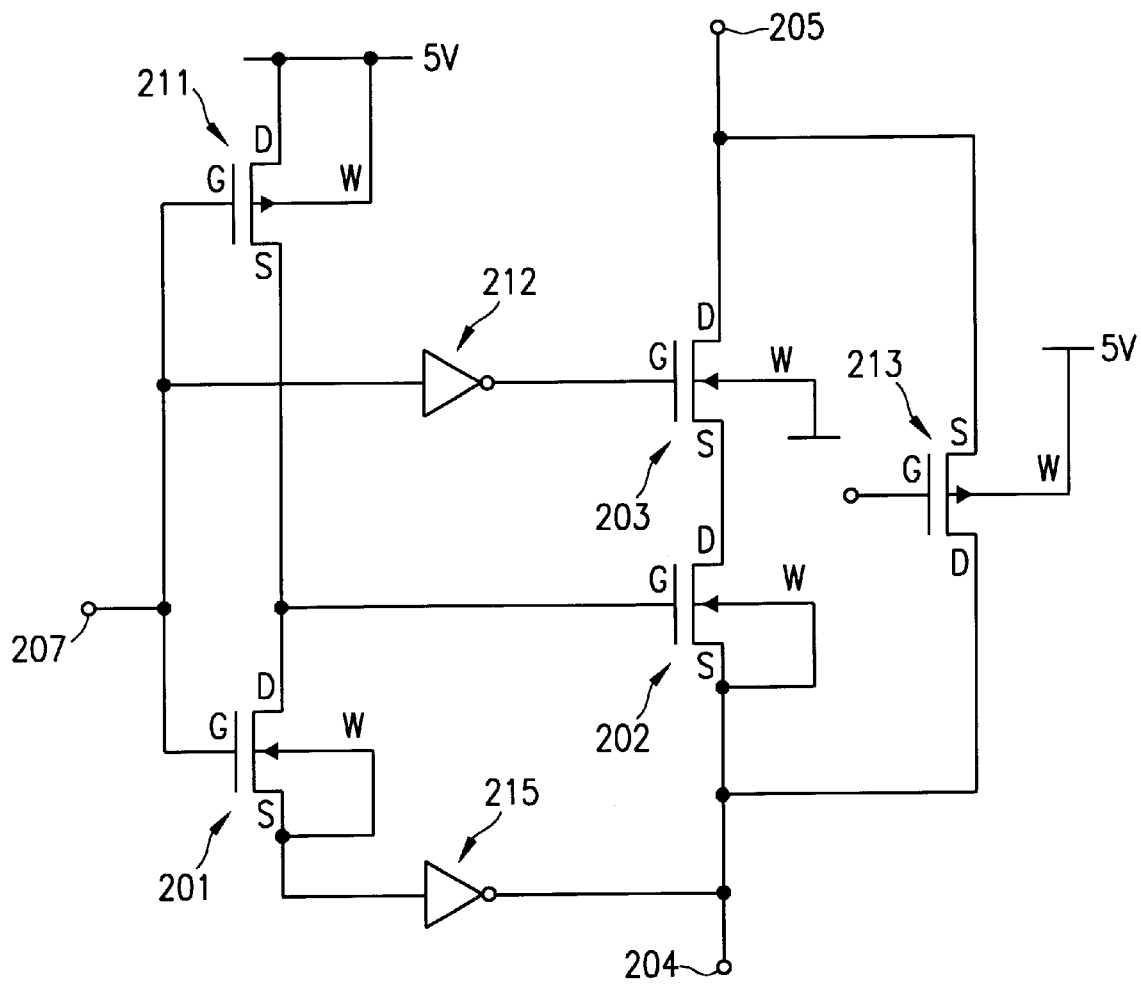
FIG. 4 shows a circuit diagram of a modification to the embodiment of FIG. 3.

FIG. 4 shows an improvement of the FIG. 3 design, in which an additional diode 215 is included between the source S and well W connection of the first NMOS transistor 201 and the input port 204.

The diode 215 serves to increase the magnitude of the negative voltage which can be applied to the port 204 when the switch is ON by the diode forward voltage drop value. Specifically, when the switch is ON, an unwanted current which would otherwise flow from the input port 204 through the channel of device 201 is blocked until the negative voltage applied to port 204 equals a voltage equal to the sum of the threshold voltage of the transistor 201 and the forward voltage drop of the diode 215.

In such a design, the gate-source threshold voltage Vt of the second MOS transistor 202 must be greater than the forward voltage drop of the diode so that, when transistor 201 is ON, it can hold transistor 202 in an OFF condition.

It will be appreciated that embodiments of the present invention have been described with specific reference to specific types of MOS transistors, and that the opposite type of MOS transistor is readily used in place of those described.

For example, the third MOS transistor could be a PMOS transistor, in which case its well would be connected to the most positive supply line of the device.

It will also be readily appreciated that each transistor in the circuits described can be replaced by a plurality of parallel or serial devices.

Alternatively, the second and/or third transistors could be replaced by a plurality of devices whose channels are connected in series with one another and whose gates are common. The well connections for such series devices would be common to one another.

The first MOS transistor could be replaced by a plurality of devices whose channels are connected in series and whose gates are common. The wells could either be common and connected to the input port or separate with each well connected to the end of the channel which is nearest to the input port.

The embodiment of the invention described in FIGS. 2, 3 and 4, can advantageously exploit the characteristics of trench isolation.

Figure 5:
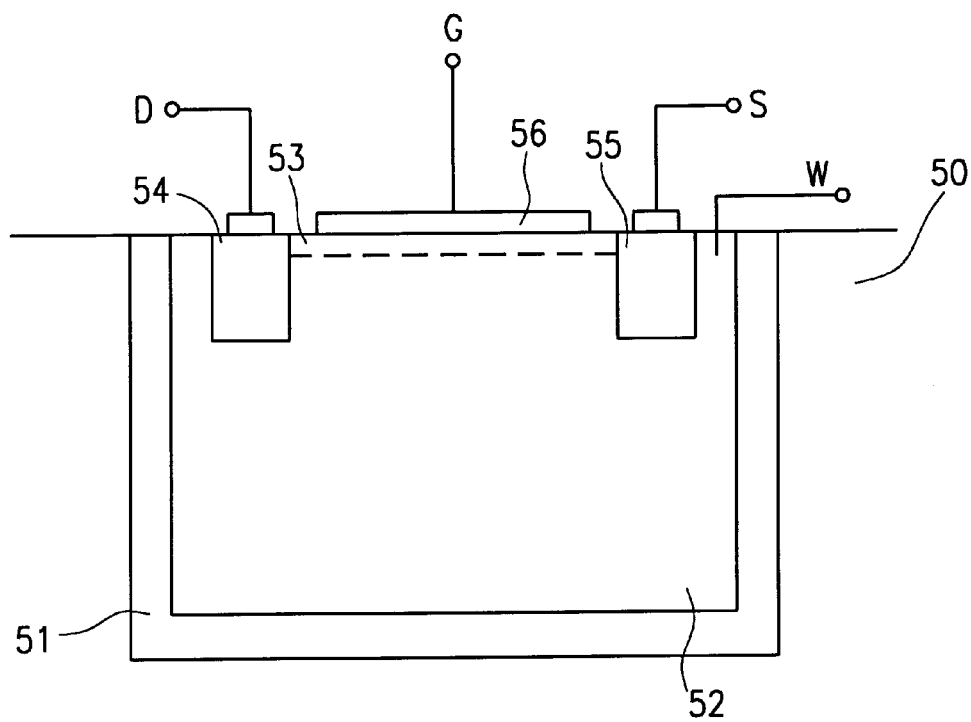
FIG. 5 schematically illustrates the fabrication of a MOS transistor used in the embodiments of present invention.

In such trench isolation the MOS devices are placed in separate ohmic isolated trenches. FIG. 5 shows a schematic diagram of one such MOS device.

The device is formed on a substrate 50 and has its well 52 isolated from the substrate material by an oxide layer 51. The substrate material is of p-type or n-type, and the well material can also be of either type of material (n-type for PMOS transistors, p-type for NMOS transistors). A conducting channel 53 is created between the drain and source connections 54 and 55 of the device. The conduction is controlled by a gate terminal 56 in conventional manner.

Alternatively, the MOS transistors can be "junction isolated" from the substrate material by forming the wells of opposite type semiconductor material from the substrate semiconductor material.

I claim:

1. An analogue switch formed on a semiconductor substrate, and comprising:

input and output ports;

a first enhancement mode MOS transistor formed in an isolated well in the substrate and having its gate connected to receive a control signal, and having one end of its conducting channel and its well connected to the input port;

a second enhancement mode MOS transistor formed in an isolated well in the substrate, and having one end of its conducting channel and its well connected to the input port, and having its gate connected to the other end of the conducting channel of the first transistor;

a third enhancement mode MOS transistor formed in an isolated well in the substrate, and having its gate connected to receive the complement of the said control signal, and having its conducting channel connected between the output port and the other end of the conducting channel of the second transistor, and having its well connected to one of a plurality of supply lines of the switch; and control means connected to the gate of the second transistor for maintaining the second transistor in an opposite state to that of the first transistor.

2. A switch as claimed in claim 1, wherein each MOS transistor has its conducting channel of the same material type as the substrate, and is formed in a well of semiconductor material of opposite type to that of the substrate.

3. A switch as claimed in claim 1, wherein each MOS transistor has its conducting channel of the same material type as the substrate, and is formed in a well of semiconductor material of opposite type to that of the substrate and wherein the substrate material is n-type semiconductor material, the well material is p-type semiconductor material and the transistors are NMOS transistors, the well of the third transistor being connected to a most negative supply line of the switch.

4. A switch as claimed in claim 1, wherein each MOS transistor has its conducting channel of the same material type as the substrate, and is formed in a well of semiconductor material of opposite type to that of the substrate, and wherein the substrate material is p-type semiconductor material, the well material is n-type semiconductor material, and the transistors are PMOS transistors, the well of the third transistor being connected to a most positive supply line of the switch.

5. A switch as claimed in claim 1, wherein each transistor is formed in a trench of an electrically isolating oxide material.

6. A switch as claimed in claim 1, wherein each transistor is formed in a trench of an electrically isolating oxide material and wherein each MOS transistor is an NMOS device and the well of the third MOS transistor is connected to a most negative supply line of the switch.

7. A switch as claimed in claim 1, wherein each transistor is formed in a trench of an electrically isolating oxide material and wherein each MOS transistor is a PMOS device and the well of the third MOS transistor is connected to a most positive supply line of the switch.

8. A switch as claimed in claim 1, wherein the control means comprises a device which tends to turn the second MOS transistor ON.

9. A switch as claimed in claim 1, wherein the control means comprises an enhancement mode MOS transistor having its gate connected to receive the control signal and its conducting channel connected between a power supply line and the gate of the second transistor.

10. A switch as claimed in claim 1, wherein each MOS transistor has its conducting channel of the same material type as the substrate, and is formed in a well of semiconductor material of opposite type to that of the substrate, wherein the substrate material is n-type semiconductor material, the well material is p-type semiconductor material and the transistors are NMOS transistors, the well of the third transistor being connected to a most negative supply line of the switch, wherein the control means comprises an enhancement mode MOS transistor having its gate connected to receive the control signal and its conducting channel connected between a positive supply line and the gate of the second transistor and wherein the said enhancement mode transistor is a PMOS transistor.

11. A switch as claimed in claim 1, wherein each MOS transistor has its conducting channel of the same material type as the substrate, and is formed in a well of semiconductor material of opposite type to that of the substrate, wherein the substrate material is p-type semiconductor material, the well material is n-type semiconductor material and the transistors are PMOS transistors, the well of the third transistor being connected to a most positive supply line of the switch, wherein the control means comprises an enhancement mode MOS transistor having its gate connected to receive the control signal and its conducting channel connected between a negative supply line and the gate of the second transistor and wherein the said enhancement mode transistor is an NMOS transistor.

12. A switch as claimed in claim 1, wherein the control means comprises a switched resistor.

* * * * *